US007433421B2

(12) United States Patent
Shako et al.

(10) Patent No.: US 7,433,421 B2
(45) Date of Patent: Oct. 7, 2008

(54) DISTORTION COMPENSATION APPARATUS

(75) Inventors: Hideharu Shako, Kawasaki (JP);
Yasuhito Funyu, Kawasaki (JP);
Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 511 days.

(21) Appl. No.: 11/147,462

(22) Filed: Jun. 8, 2005

(65) Prior Publication Data
US 2006/0188038 A1 Aug. 24, 2006

(30) Foreign Application Priority Data
Feb. 21, 2005 (JP) .............. 2005-044632

(51) Int. Cl.
*H04L 25/49* (2006.01)
(52) U.S. Cl. .................................. 375/296
(58) Field of Classification Search ......... 332/123–125, 332/159–161, 149; 375/295–297
See application file for complete search history.

(56) References Cited

U.S. PATENT DOCUMENTS

| 5,404,378 A * | 4/1995 | Kimura ................... 375/296 |
| 6,091,941 A * | 7/2000 | Moriyama et al. .......... 455/126 |
| 6,751,447 B1 * | 6/2004 | Jin et al. ................. 455/114.3 |
| 6,836,517 B2 | 12/2004 | Nagatani et al. |
| 6,864,745 B2 * | 3/2005 | Ode et al. .................. 330/149 |
| 7,106,133 B2 * | 9/2006 | Hamada et al. ............ 330/149 |
| 7,215,717 B2 * | 5/2007 | Doi .......................... 375/297 |
| 7,242,247 B2 * | 7/2007 | Hirose et al. ............... 330/149 |
| 2003/0080814 A1 * | 5/2003 | Ode et al. ................. 330/149 |
| 2004/0212428 A1 * | 10/2004 | Ode et al. ................. 330/149 |

FOREIGN PATENT DOCUMENTS

| JP | 2001-189685 | 7/2001 |
| WO | WO 03/103163 | 12/2003 |

* cited by examiner

*Primary Examiner*—Tesfaldet Bocure
(74) *Attorney, Agent, or Firm*—Hanify & King, P.C.

(57) ABSTRACT

A distortion compensation apparatus is provided to restrain an increased calculation time caused by a large amount of calculation required for obtaining a phase variation amount for compensation from the correlation. The distortion compensation apparatus includes an update calculation section calculating a distortion compensation coefficient by use of an adaptive algorithm; a distortion compensation section performing distortion compensation to the transmission signal, based on the distortion compensation coefficient being read out from the distortion compensation coefficient storage; a correlation calculation section calculating a real part of correlation and an imaginary part of correlation of each the reference signal and the feedback signal; and a phase rotation section compensating a relative phase deviation between the reference signal and the feedback signal, based on the real part of correlation and the imaginary part of correlation calculated by the correlation calculation section, wherein the update calculation section calculates a distortion compensation coefficient using the post-compensation signal.

12 Claims, 16 Drawing Sheets

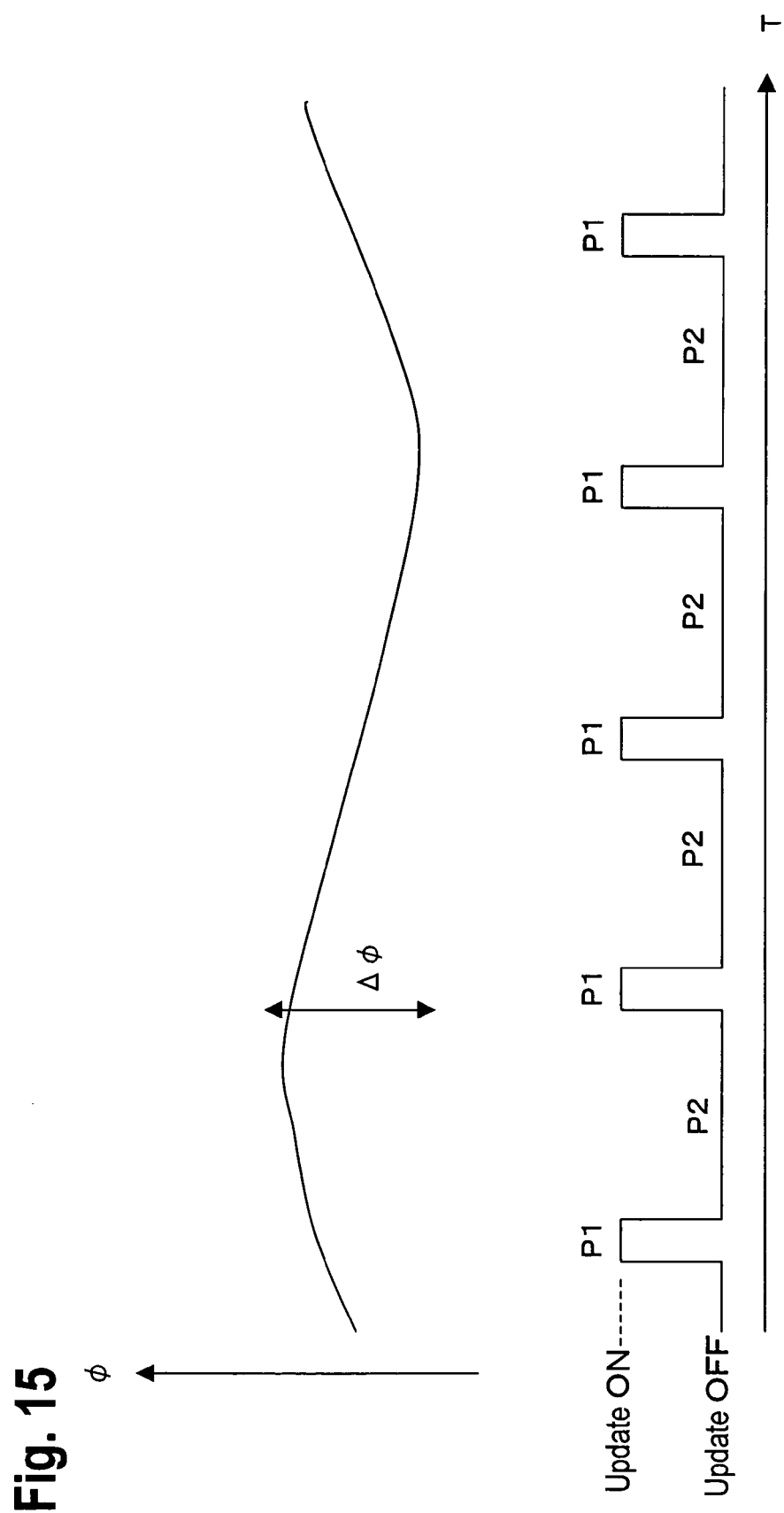

DISTORTION COMPENSATION APPARATUS

BACKGROUND OF THE INVENTION

1. Field of the Invention

The present invention relates to a distortion compensation apparatus, and more particularly a distortion compensation apparatus which obtains a differential signal between a reference signal, i.e. a transmission signal, and a feedback signal, calculates a distortion compensation coefficient to reduce the differential signal by use of an adaptive algorithm, updates a stored distortion compensation coefficient using the above-calculated distortion compensation coefficient, and performs distortion compensation to the transmission signal based on the distortion compensation coefficient obtained above. In particular, preferably, the present invention relates to a digital predistortion device updating the stored data in a lookup table (LUT) having distortion compensation coefficients.

2. Description of the Related Art

In recent years, high-efficient digital transmission has been adopted in the radio communication field. When multilevel phase modulation is adopted in the radio communication, a technique for reducing adjacent channel leak power becomes important, in which nonlinear distortion is restrained by linearizing the amplification characteristic of a power amplifier on the transmission side.

Also, to improve power efficiency even in case an amplifier having a degraded linearity is used, a technique for compensating nonlinear distortion for the degraded linearity is necessary.

FIG. 1 shows an exemplary block diagram of transmission equipment in the conventional radio equipment. A transmission signal generator 1 outputs a digital serial data sequence. Also, a serial-to-parallel (S/P) converter 2 converts the digital data sequence into two series, in-phase component (I-component) signals and quadrature component (Q-component) signals, by alternately distributing the digital data sequence on a bit-by-bit basis.

A digital-to-analog (D/A) converter 3 converts the respective I-signals and Q-signals into analog baseband signals, and inputs the signals into a quadrature modulator 4. This quadrature modulator 4 performs orthogonal transformation and outputs signals by multiplying the input I-signals and Q-signals (transmission baseband signals) by a reference carrier wave 8 and a carrier wave phase-shifted therefrom by 90°, respectively, and adding the multiplied results.

A frequency converter 5 mixes the quadrature modulation signals with local oscillation signals, and converts the mixed signals into radio frequency. A transmission power amplifier 6 performs power amplification of the radio frequency signals output from frequency converter 5, and radiates the signal to the air from an antenna 7.

Here, in the mobile communication using W-CDMA, etc., transmission equipment power is substantially large, becoming as much as 10 mW to several tens of mW, and transmission power amplifier 6 has a nonlinear input/output characteristic having a distortion function f(p), as shown by the dotted line in FIG. 2. This non-linearity causes a non-linear distortion. As shown by the solid line (b) in FIG. 3, the frequency spectrum in the vicinity of a transmission frequency $f_0$ comes to have a raised sidelobe from the characteristic shown by the broken line (a). This leaks to adjacent channels and produces adjacent interference. Namely, due to the nonlinear distortion shown in FIG. 2, leak power of the transmission wave to the adjacent frequency channels becomes large, as shown in FIG. 3.

An ACPR (adjacent channel power ratio) is used to indicate the magnitude of leak power. ACPR is a ratio of leak power to adjacent channels to the power in the channel of interest, in other words, a ratio of the spectrum area in the adjacent channels sandwiched between the lines B and B' in FIG. 3 to the spectrum area between the lines A and A'. Such leak power affects other channels as noise, and degrades communication quality of the channels concerned. Therefore, a strict regulation has been established to the issue of leak power.

The leak power is substantially small in a linear region of, for example, a power amplifier (refer to a linear region I in FIG. 2), but is large in a nonlinear region II. Accordingly, to obtain a high-output transmission power amplifier, the linear region I has to be widened. However, for this purpose, it becomes necessary to provide an amplifier having a larger capacity than is actually needed, which causes disadvantage in apparatus cost and size. As a measure to solve this problem, a distortion compensation function to compensate for transmission power distortion is added to radio equipment.

FIG. 4 shows the block diagram of transmission equipment having a digital nonlinear distortion compensation function by use of a DSP (digital signal processor). A digital data group (transmission signals) transmitted from transmission signal generator 1 is converted into two series, I-signals and Q-signals, in S/P converter 2, and then the two series of signals are input to a distortion compensator 9.

As shown in the lower part of FIG. 4 in enlargement, distortion compensator 9 includes a distortion compensation coefficient storage 90 for storing a distortion compensation coefficient h(pi) corresponding to the power level pi(i=0–1023) of a transmission signal x(t); a predistortion portion 91 for performing a distortion compensation process (predistortion) onto the transmission signal, using the distortion compensation coefficient h(pi) corresponding to the transmission signal power level; and a distortion compensation coefficient calculator 92 for comparing the transmission signal x(t) with a demodulation signal (a feedback signal) y(t) demodulated in the quadrature detector which will be described later, and calculates and updates the distortion compensation coefficient h(pi) so that the difference between the transmission signal and the demodulation signal becomes zero.

The signal to which distortion process is performed in distortion compensator 9 is input into D/A converter 3. D/A converter 3 converts the input I-signal and Q-signal into analog baseband signals, and inputs the converted signals into quadrature modulator 4. Quadrature modulator 4 performs quadrature modulation by multiplying the input I-signal and Q-signal by a reference carrier wave 8 and a carrier wave being phase-shifted from carrier wave 8 by 90°. Quadrature modulator 4 then adds and outputs the multiplied result.

A frequency converter 5 mixes the quadrature modulation signal with a local oscillation signal, and performs frequency conversion. A transmission power amplifier 6 performs power amplification of the radio frequency signal output from frequency converter 5, and radiates the signal to the air by an antenna 7.

A portion of the transmission signal is input to a frequency converter 11 via a directional coupler 10, and input into a quadrature detector 12 after being converted by the above frequency converter 11. Quadrature detector 12 performs quadrature detection by multiplying the input signal by a reference carrier wave, and by a signal which is phase shifted by 90° from the reference signal, respectively. Thus, the baseband I-signal and Q-signal on the transmission side are reproduced, which are then input into an analog-to-digital (A/D) converter 13.

A/D converter 13 converts the input I-signal and Q-signal into digital signals, and inputs into distortion compensator 9. Through the adaptive signal processing, using an LMS (least-mean-square) algorithm, in distortion compensation coefficient calculator 92 of distortion compensator 9, the pre-compensated transmission signal is compared with the feedback signal being demodulated in quadrature detector 12. Then distortion compensator 9 calculates the distortion compensation coefficient h(p1) so as to make the above difference zero. Then, distortion compensator 9 updates the above-obtained coefficient which has been stored in distortion compensation coefficient storage 90. Through the repetition of calculations above, nonlinear distortion in transmission power amplifier 6 is restrained, and adjacent channel leak power is reduced.

FIG. 5 shows an explanation diagram when the distortion compensation processing is performed using the adaptive LMS in distortion compensator 9 shown in FIG. 4.

A symbol 15a is a multiplier for multiplying a transmission signal x(t) by a distortion compensation coefficient $h_{n-1}(p)$. This multiplier corresponds to the predistortion portion 91 shown in FIG. 4. Also, 15b is a transmission power amplifier having a distortion function f(p), and 15c is a feedback system in which feedback the output signal y(t) being output from transmission power amplifier 15b is performed. Also, 15d is a calculator (amplitude/power converter) for calculating a power $p(=x^2(t))$ of the transmission signal x(t), and 15e is a distortion compensation coefficient storage (which corresponds to distortion compensation coefficient storage 90 shown in FIG. 4) for storing the distortion compensation coefficients each corresponding to each power of the transmission signal x(t).

Distortion compensation coefficient storage 15e outputs a distortion compensation coefficient $h_{n-1}(p)$ corresponding to the power p of the transmission signal x(t). Distortion compensation coefficient storage 15e also updates a distortion compensation coefficient $h_{n-1}(p)$ with distortion compensation coefficient $h_n(p)$ obtained by the LMS algorithm.

Further, 15f is a conjugate complex signal output portion, 15g is a subtractor outputting a difference e(t) between a transmission signal x(t) and a feedback demodulation signal y(t), 15h is a multiplier multiplying e(t) by u*(t), 15i is a multiplier multiplying $h_{n-1}(p)$ by y*(t), and 15j is a multiplier multiplying by a step size parameter μ, and 15k is an adder adding $h_{n-1}(p)$ to μe(t)u*(t). Also, 15m, 15n, 15p are delay portions by which a delay time D is added to the input signal. Here, the delay time D denotes a time duration from the time the transmission signal x(t) is input to the time the feed backed demodulation signal y(t) is input to subtractor 15g.

Symbols 15f and 15h-15j constitute a rotation calculation section 16. A signal y(t) is the signal after being distorted. The delay time D being set in delay portions 15m, 15n, 15p is determined so as to satisfy D=D0+D1, where D0 is the delay time in transmission power amplifier 15b, and D1 is the delay time in feedback system 15c.

When this delay time D is not set correctly, the distortion compensation function does not work effectively. Also, the greater the set error in the delay time is produced, the greater the leak power to the adjacent channels due to the sidelobe being produced occurs.

Using the above configuration, the following calculations are performed.

$h_n(p)=h_{n-1}(p)+\mu e(t)u^*(t)$ $e(t)=x(t)-y(t)$ $y(t)=h_{n-1}(p)x(t)f(p)$ $u^*(t)=x^*(t)f^*(p)=h_{n-1}(p)y^*(t)$ $p=|x(t)|^2$

Here, x, y, f, h, u, e are complex numbers, and * denotes a conjugate complex number.

Through the above calculation processing, the distortion compensation coefficient h(p) is updated so as to minimize the differential signal e(t) between the transmission signal x(t) and the feedbacked demodulation signal y(t). Finally, the value converges to an optimal distortion compensation coefficient, so that the distortion of the transmission power amplifier is compensated.

As described above, the principle of the distortion compensation apparatus is that feedback detection of a carrier wave obtained after quadrature modulation of the transmission signal is performed, the amplitudes of the transmission signal and the feedback signal are compared after digital conversion, and a distortion compensation coefficient is updated real time based on the above comparison result. According to this nonlinear distortion compensation system, it is possible to reduce distortion, and leak power as well, even through the operation is performed in a nonlinear region with high output, and also to improve the power load efficiency.

Now, in regard to the above setting of the delay time in the prior application, the applicant of the present invention has proposed one method, which is disclosed in the official gazette of the Japanese Unexamined Patent Publication No. 2001-189685. The method disclosed in the above patent publication is outlined below: A correlation value is calculated varying the phases between a transmission signal x(t) and a feedback signal. Based on the maximum value of this correlation, a total delay time produced in a distortion device (transmission power amplifier), a feedback loop, etc. is determined. The determined delay time is then set in each delay circuit for timing adjustment in the distortion compensation apparatus.

However, even once the delay time D is set correctly to satisfy D=D0+D1, in some cases, a stable and satisfactory distortion compensation operation may not be obtainable, and unnecessary outband radiation power may be produced.

This is caused by a clock jitter produced by thermal noise and other external disturbance in the analog system including an A/D converter and a D/A converter. Presence of the clock jitter causes an intense fluctuation in a feedback signal phase, and affects convergence of the distortion compensation coefficient.

The jitter produces repeated variations in the clock speed, to higher or lower. As a result, the feedback signal phases vary against the reference signal phases, as exemplarily shown in FIG. 6.

If such a phase variation caused by the clock jitter is not considered, the distortion compensation coefficient becomes unstably vibrated within the range of the phase variation. Because the distortion compensation coefficient is multiplied to the transmission signal, this causes unnecessary waves being produced.

Considering the above, in the prior application, which is disclosed in the PCT International Publication WO 03/103163, the applicant of the present invention has proposed the invention to enable a stable and satisfactory distortion compensation operation even when the phase difference between a reference signal and a feedback signal varies due to a jitter.

An exemplary embodiment of the invention disclosed in the prior application is shown in FIG. 7. In this FIG. 7, a distortion compensation coefficient lookup table (LUT) 61 is employed as a distortion compensation coefficient storage 15e (refer to FIG. 5), for storing distortion compensation coefficients corresponding to each power of transmission signals x(t).

Further, in FIG. 8, it is assumed that a phase difference φ is produced between the reference signal and the feedback signal, as shown by A, caused by the clock jitter. In such a case, if it is intended to correct this phase difference simply by detecting the phase difference φ between the reference signal and the feedback signal, phase correction cannot follow high-speed phase variation caused by the jitter.

Therefore, even when update of the distortion compensation coefficient lookup table 61 is performed through the phase correction, the distortion compensation coefficient cannot converge stably affected by a phase difference $\phi_{pp}$, which impedes to obtain a satisfactory distortion compensation operation. Accordingly, in the invention disclosed in the prior application, an intermittent controller 69 is provided. With this, a phase correction period Δt and a distortion compensation coefficient update period ΔT are alternately generated.

The following method has been proposed in the prior invention: The phase difference φ between the reference signal and the feedback signal is corrected in the phase correction period Δt. Also, the distortion compensation coefficient is updated in the distortion compensation coefficient update period ΔT. The above operation is repeated thereafter.

More specifically, in the phase correction period Δt, the phase difference φ is measured for n times and averaged. Phase correction is then performed based on a mean phase difference. Further, in the distortion compensation coefficient update period ΔT having smaller phase difference than before as a result of the correction, the distortion compensation coefficient is updated at each clock.

Here, it is considered that the distortion compensation coefficient update period ΔT is sufficiently shorter than the period of phase variation.

As described above, according to the invention disclosed in the prior application, (i) the phase difference between the reference signal and the feedback signal is corrected; (ii) the distortion compensation coefficient is updated in the period when the phase difference becomes smaller as a result of the phase correction; (iii) update of the distortion compensation coefficient is suspended when the phase difference becomes greater, and instead, the phase difference is corrected; and (iv) thereafter, the distortion compensation coefficient is updated. Then, the above operation is repeated.

According to the invention in the prior application, the distortion compensation coefficient can be made to converge promptly without being affected by the phase difference, only by the effect of the phase difference of Δφ. Further, the distortion compensation coefficient update period is determined based on the phase difference between the reference signal and the feedback signal which is existent before the correction of the phase difference.

For example, the distortion compensation coefficient update period ΔT is set longer when the phase difference between the reference signal and the feedback signal is smaller, as shown by B. On the other hand, the distortion compensation coefficient update period ΔT is set shorter when the phase difference between the reference signal and the feedback signal is greater, as shown by C. With such a measure, when the phase difference is smaller, it becomes possible to make the distortion compensation coefficient converge promptly, because the update period can be set longer. In contrast, when the phase difference is greater, the distortion compensation coefficient update period becomes shorter, and the update of the distortion compensation coefficient is performed only in the period when the phase difference becomes smaller as a result of the correction.

Now, a further explanation will be given hereafter about the embodiment configuration (FIG. 7) according to the invention described in the patent document 2 mentioned earlier.

In FIG. 7, for a digital data group (transmission signals) forwarded from a transmission signal generator (not shown), distortion compensation processing is performed in distortion compensation apparatus 51, and is input to a D/A converter 52. This D/A converter 52 converts the digital transmission signal to an analog signal, and is input to a power amplifier 53 either directly or through a quadrature modulator and a frequency converter (which are not shown).

Power amplifier 53 amplifies the input signal and radiates to the air. The output of power amplifier 53 is input into an A/D converter 54 either directly or through a frequency converter and a quadrature demodulator (which are not shown). A/D converter 54 converts this input signal into a digital signal, and inputs the converted signal into a distortion compensation apparatus 51.

In distortion compensation apparatus 51, a distortion compensation coefficient lookup table (LUT) 61 stores a multiplicity of distortion compensation coefficients h(n) according to the power of each transmission signal x(t). A multiplier 62 multiplies each transmission signal by a distortion compensation coefficient h(n) corresponding to the transmission signal, and thus distortion compensation processing is performed.

An address generator 63 generates a readout address AR corresponding to the power of the transmission signal x(t). Address generator 63 then reads out a distortion compensation coefficient h(n) according to the above power, from distortion compensation coefficient lookup table 61, and inputs the readout distortion compensation coefficient h(n) into a multiplier 62.

Address generator 63 also generates a write address AW, and updates a distortion compensation coefficient by storing the distortion compensation coefficient h(n+1), which has been calculated in a distortion compensation coefficient updater 67, into distortion compensation coefficient lookup table 61. A delay circuit 64 outputs a reference signal x'(t) by delaying the input signal for a time duration from when the transmission signal x(t) is input to when a feedback signal y(t) is input to a subtractor 66. A complex multiplier 65 corrects the phase of the feedback signal y(t) so that the phase difference between the reference signal x'(t) and the feedback signal, which is output from A/D converter 54, becomes zero.

Subtractor 66 obtains a differential signal e(t) of between the reference signal x'(t) and the phase-corrected feedback signal y'(t). A distortion compensation coefficient updater 67 receives the differential signal e(t), and calculates a distortion compensation coefficient h(n+1) to reduce the above differential signal e(t), using an adaptive algorithm. Then, distortion compensation coefficient updater 67 updates the content h(n) of distortion compensation coefficient lookup table 61.

A phase adjustment circuit 68 detects a phase difference φ between the reference signal x'(t) and the feedback signal y'(t), and inputs the phase difference φ into complex multiplier 65. An intermittent controller 69 alternately generates a phase correction period Δt and a distortion compensation coefficient update period ΔT, and controls to perform a phase correction process and a distortion compensation coefficient update process alternately.

FIG. 9 shows a configuration diagram of a phase difference detector in phase adjustment circuit 68 shown in FIG. 7.

Although not explicitly shown in FIG. 7, the transmission signal x(t) and the feedback signal y(t) are complex signals, and can be represented as follows:

$$x(t)=Is+jQs$$

$$y(t)=IF+jQF$$

A quadrant detector 68a detects the quadrant in which a transmission signal x(t) is existent. A magnitude comparator 68b compares the magnitude of the real part with the imaginary part of the transmission signal x(t). Further, a vector existence angle range decider 68c decides in which section being divided on a 45-degree basis the transmission signal x(t) exists, based on the quadrant in which the transmission signal x(t) is existent and the comparison result of the magnitude, as shown in FIG. 10.

Similarly, a quadrant detector 68d detects the quadrant in which the feedback signal y(t) is existent. A magnitude comparator 68e compares the magnitude of the real part with the imaginary part. Further, a vector existence angle range decider 68f decides in which section being divided on a 45-degree basis the feedback signal y(t) exists, based on the quadrant in which the transmission signal x(t) is existent and the comparison result of the magnitude.

As such, a phase difference calculator 68g calculates the phase difference on a 45-degree basis, based on the sections of the transmission signal x(t) and the feedback signal y(t).

For example, assuming the transmission signal x(t) exists in a section IA, and the feedback signal y(t) exists in a section IIA, the phase difference is 90 degrees. An averaging section 68h calculates the mean value of the phase difference calculated in phase difference calculator 68g in the phase correction period, and sets this mean phase difference into complex multiplier 65.

As explained above, according to the invention described in the prior application (patent document 2), as shown in FIGS. 7 and 9, phase adjustment circuit 68 for exclusive use is needed.

However, according to the above-mentioned invention described in the prior application in the patent document 2, in order to obtain the phase difference, a multiplicity of circuits are to be constituted for the purposes of quadrant detection, magnitude comparison, and decision of the angle in which a vector exists. These circuits are not for general use and the cost becomes high.

SUMMARY OF THE INVENTION

Accordingly, it is an object of the present invention to provide a distortion compensation apparatus having a simplified configuration for phase adjustment.

It is another object of the present invention to provide a distortion compensation apparatus, restraining an increased calculation time caused by a large amount of calculation required for obtaining a phase variation amount for compensation from the correlation.

As a first aspect of the present invention to achieve the aforementioned object, a distortion compensation apparatus includes: an update calculation section calculating a distortion compensation coefficient by use of an adaptive algorithm, so as to reduce a differential signal between a reference signal, which is a transmission signal, and a feedback signal; a distortion compensation coefficient storage of which stored content is updated by the calculated distortion compensation coefficient; a distortion compensation section performing distortion compensation to the transmission signal, based on the distortion compensation coefficient being read out from the distortion compensation coefficient storage; the reference signal and the feedback signal are complex signals, and a correlation calculation section calculating a real part of correlation and an imaginary part of correlation of each the reference signal and the feedback signal; and a phase rotation section compensating a relative phase deviation between the reference signal and the feedback signal, based on the real part of correlation and the imaginary part of correlation calculated by the correlation calculation section. The update calculation section calculates a distortion compensation coefficient using the post-compensation signal.

As a second aspect of the present invention to achieve the aforementioned object, in the first aspect, preferably, the distortion compensation apparatus further includes a storage storing correspondence relation between a value in a predetermined range among the values obtained by the calculation of [the real part of correlation/the imaginary part of correlation] and phase information $\phi$. The phase rotation section performs the compensation based on phase information $\phi$ obtained from the correspondence relation.

As a third aspect of the present invention to achieve the aforementioned object, in the second aspect, preferably, the storage stores a plurality of sets of phase information to be selected when the value obtained from the calculation of [the real part of correlation/the imaginary part of correlation] is out of the predetermined range. When the value obtained from the calculation of [the real part of correlation/the imaginary part of correlation] is out of the predetermined range, the phase rotation section performs the compensation based on the phase information selected from among the plurality of sets of phase information.

As a fourth aspect of the present invention to achieve the aforementioned object, in the third aspect, preferably, the selection is performed based on the respective signs of the real part of correlation and the imaginary part of correlation.

As a fifth aspect of the present invention to achieve the aforementioned object, a distortion compensation apparatus updates stored data of distortion compensation coefficients to be applied, based on a differential signal between a reference signal and a feedback signal. The distortion compensation apparatus includes: a detection section for detecting a phase deviation between the reference signal and the feedback signal; and an update control section for restraining update processing of the distortion compensation coefficient based on the reference signal and the feedback signal, when the phase deviation exceeds a predetermined value.

Further scopes and features of the present invention will become more apparent by the following description of the embodiments with the accompanied drawings.

BRIEF DESCRIPTION OF THE DRAWINGS

FIG. 15 shows a diagram illustrating a process for calculating a distortion compensation coefficient to be updated, in the configuration of the embodiment shown in FIG. 11.

DETAILED DESCRIPTION OF THE INVENTION

The preferred embodiment of the present invention is described here in after referring to the charts and drawings. However, it is noted that these embodiments are described for the sake of easier understanding of the present invention, and that the scope of the present invention is not limited to the embodiments described below.

According to the present invention, a configuration for performing phase adjustment in a distortion compensation apparatus is simplified. At the same time, a configuration for shortening a CPU calculation time is presented.

Figure 11:
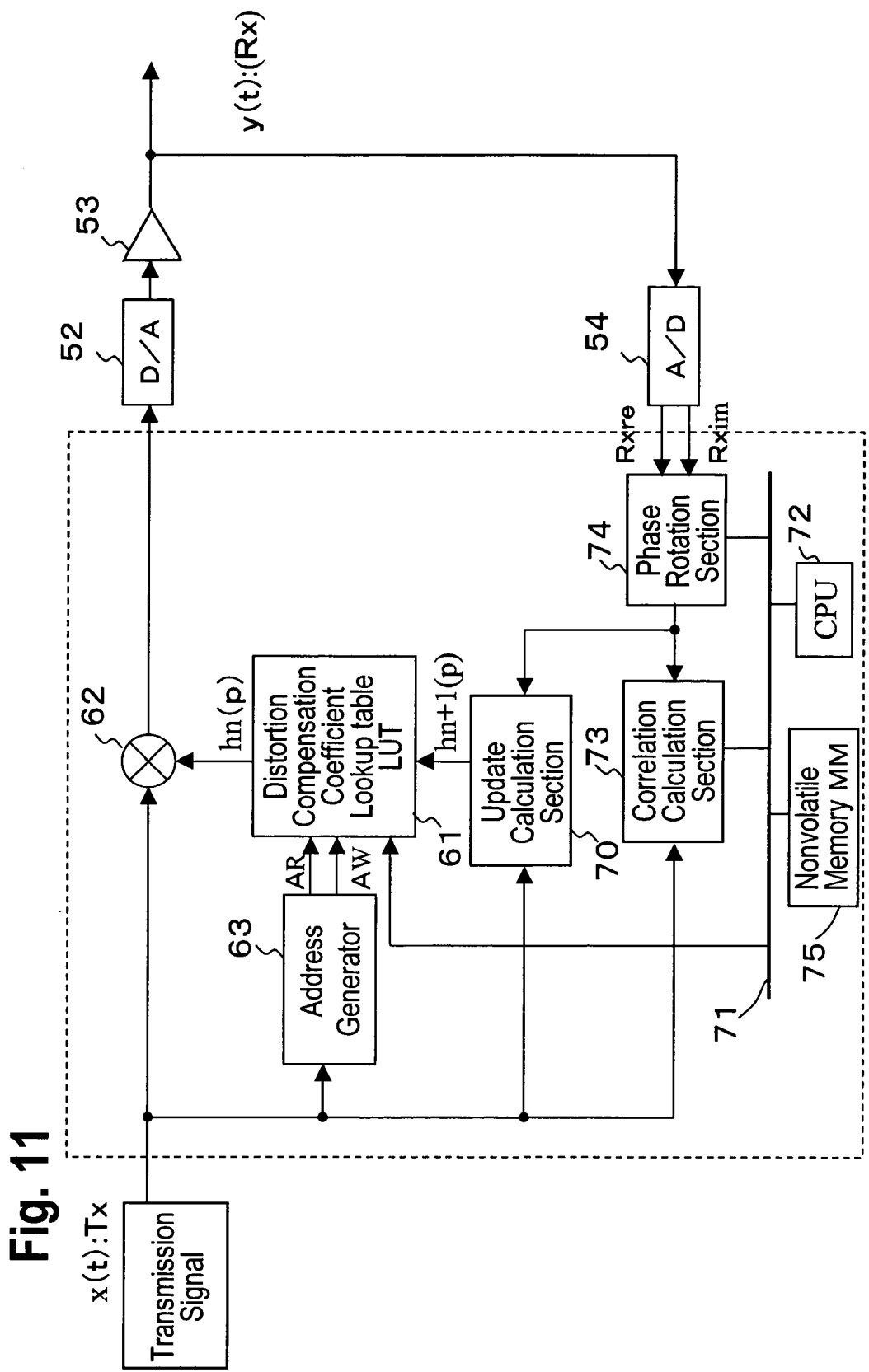
FIG. 11 shows a block diagram of an exemplary configuration according to an embodiment of the present invention.

FIG. 11 is a block diagram of an exemplary configuration according to an embodiment of the present invention. Here, the portions, to which the same configuration as in the embodiment of the prior invention is applicable, are also applied in the present invention. The same reference numbers are added to the above portions.

Figure 1:
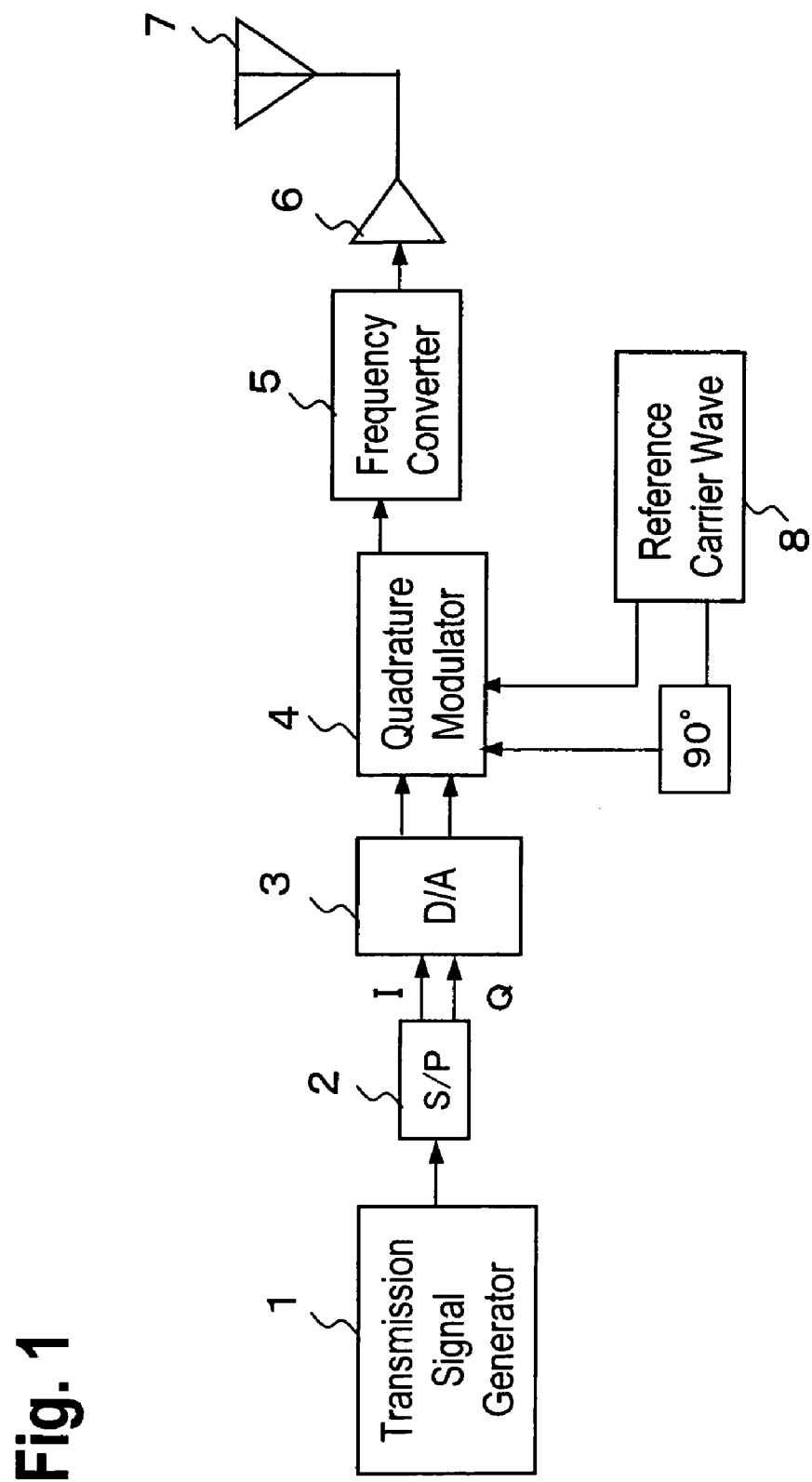
FIG. 1 shows a block diagram of an example of transmission equipment of the conventional radio apparatus.
Figure 2:
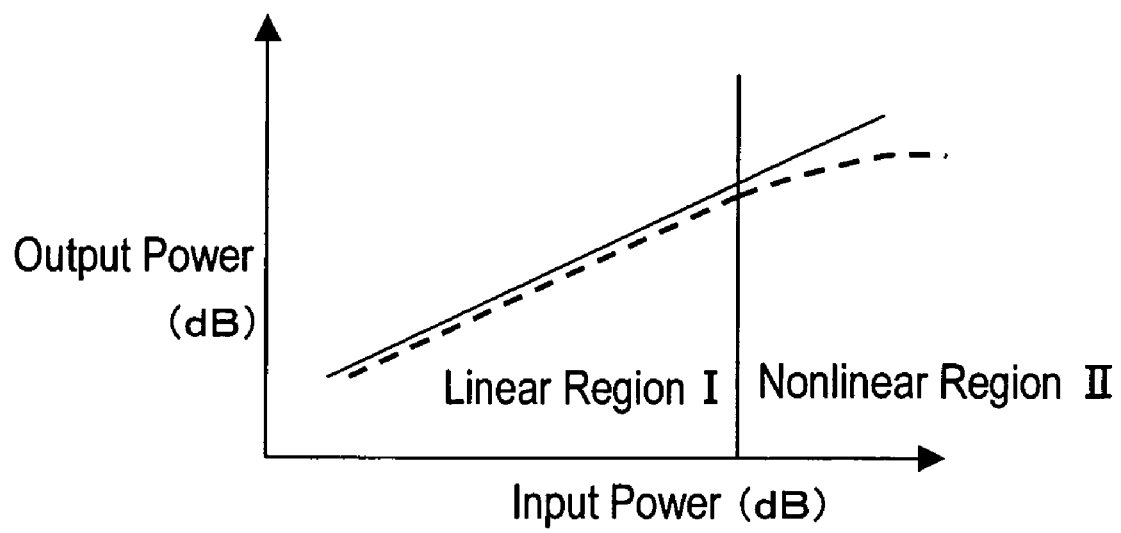
FIG. 2 shows a diagram illustrating an input/output characteristic (having a distortion function f(p)) of a transmission power amplifier.
Figure 3:
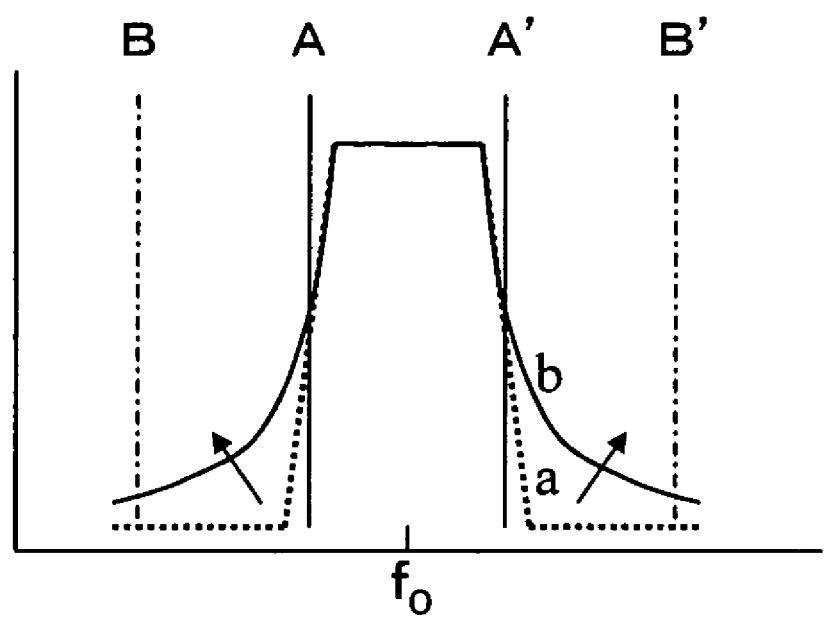
FIG. 3 shows a diagram illustrating a nonlinear distortion produced due to the nonlinear characteristic.
Figure 4:
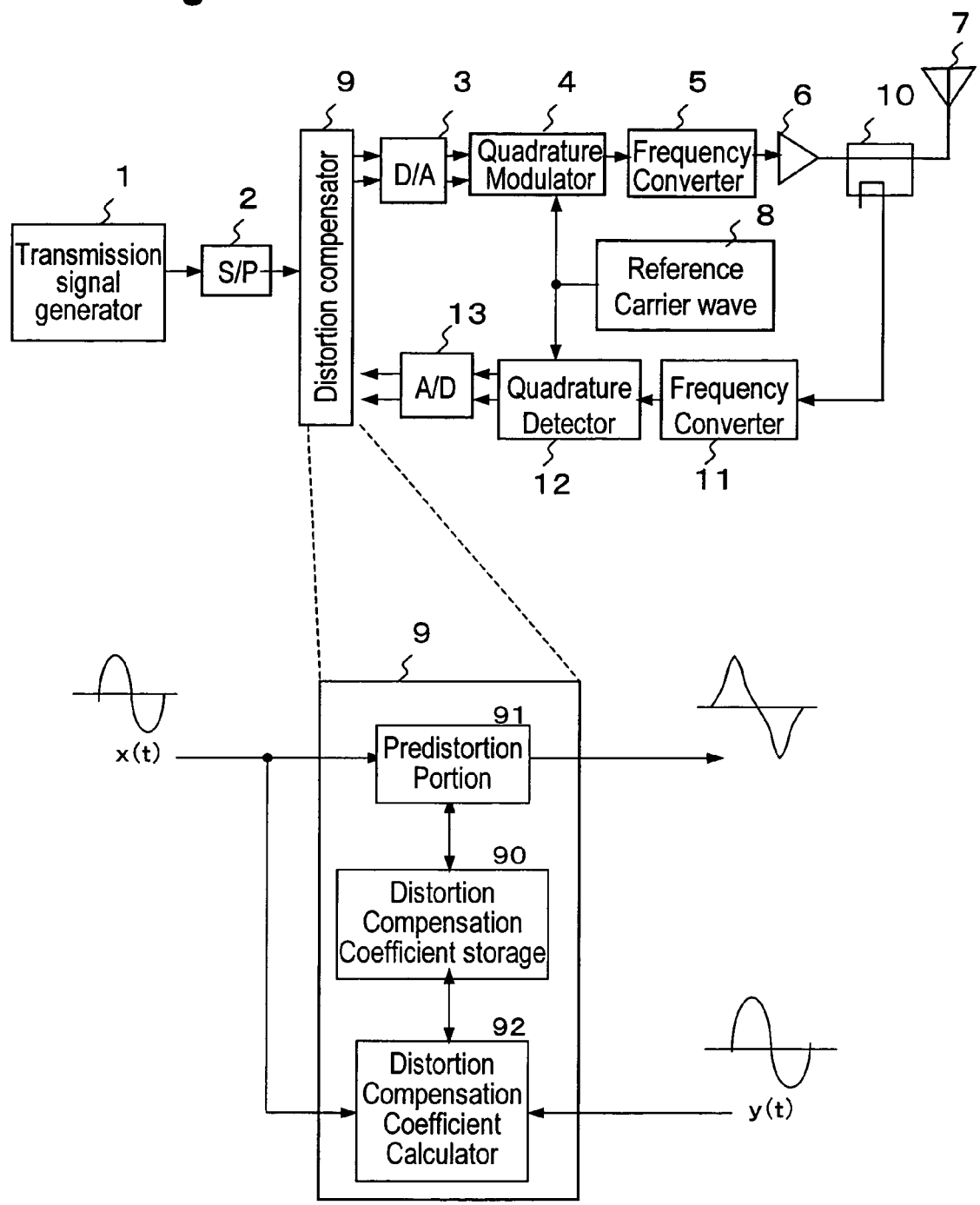
FIG. 4 shows a block diagram of transmission equipment having a digital nonlinear distortion compensation function using a DSP (digital signal processor).
Figure 5:
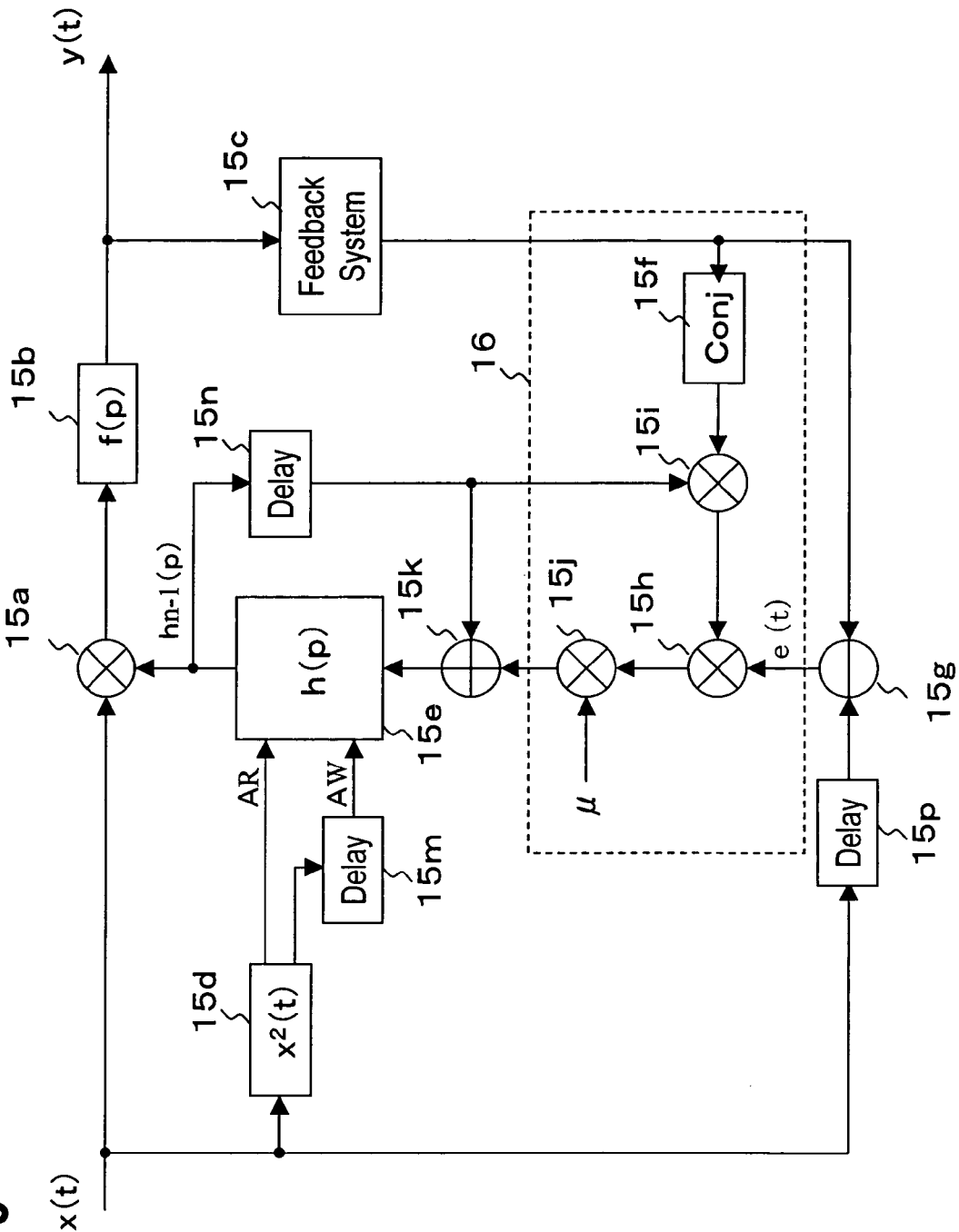
FIG. 5 shows an explanation diagram in case of performing distortion compensation processing using an adaptive LMS in a distortion compensator 9 shown in FIG. 4.
Figure 6:
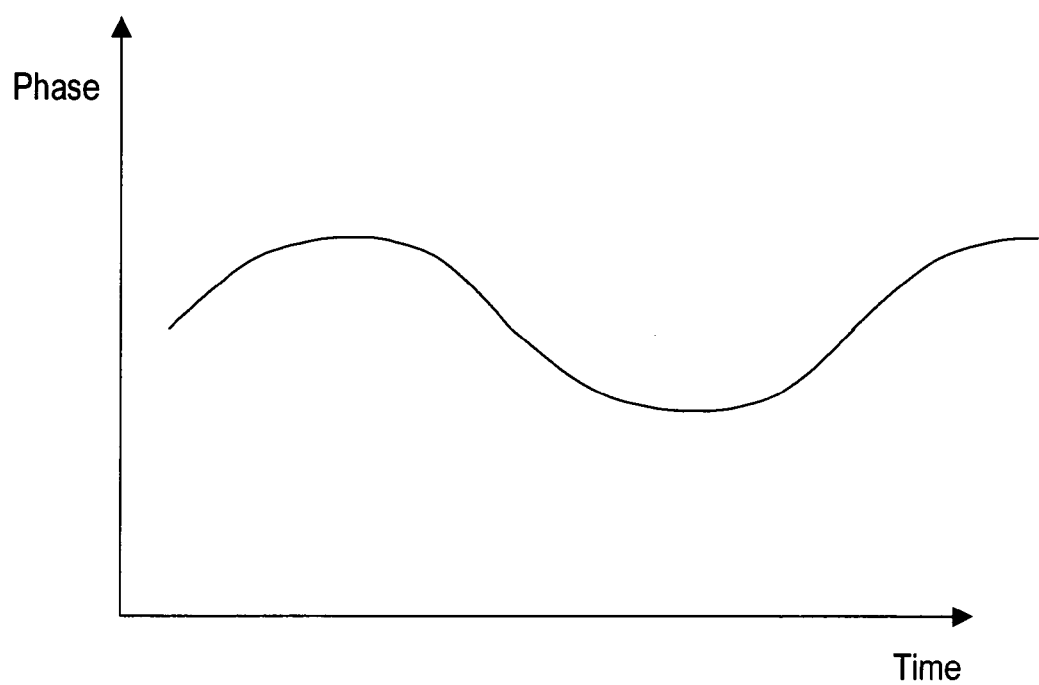
FIG. 6 shows a diagram illustrating phase variation of a feedback signal against a reference signal.
Figure 7:
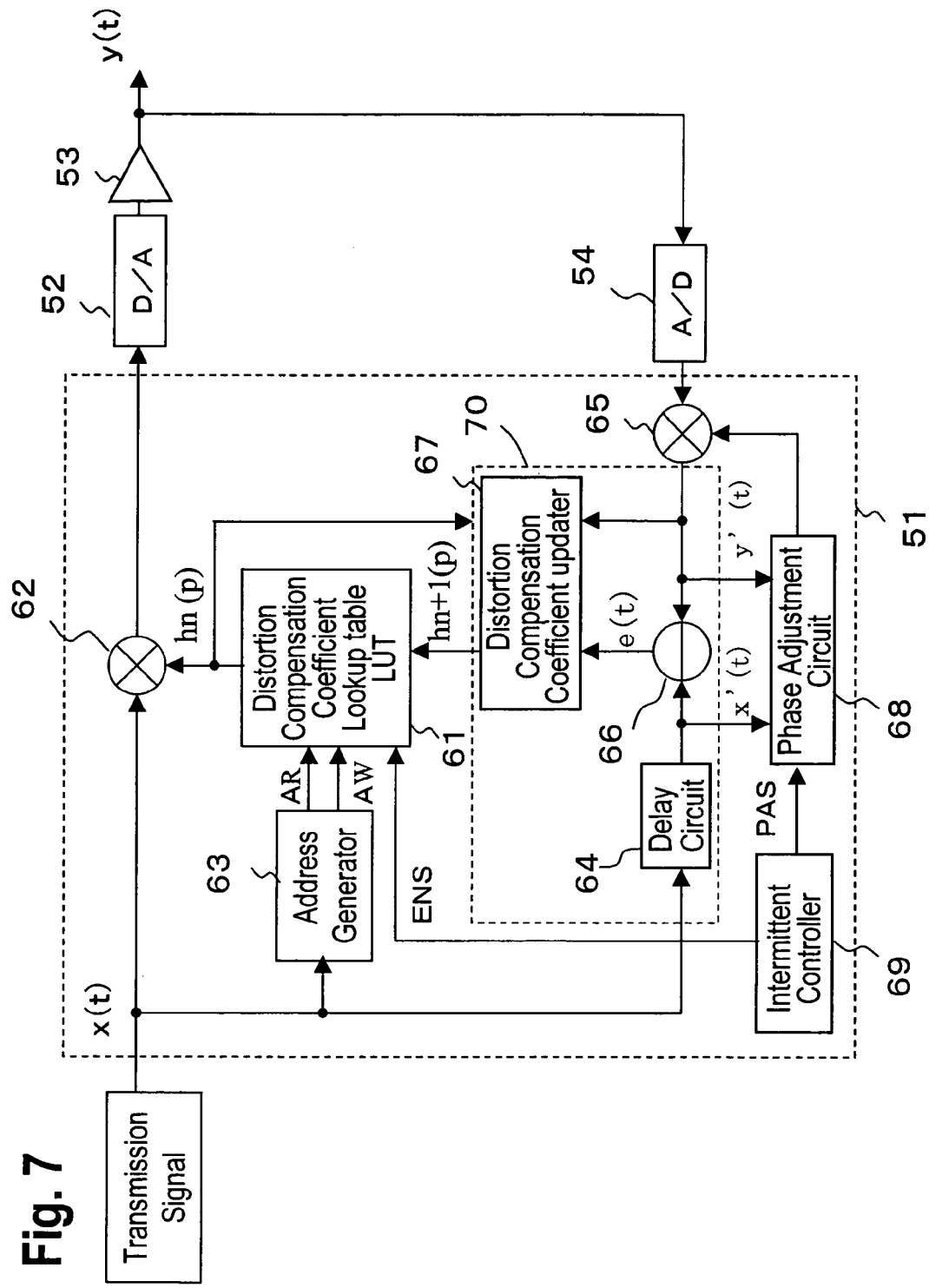
FIG. 7 shows a diagram illustrating a configuration of an exemplary embodiment according to the invention of the prior application.
Figure 8:
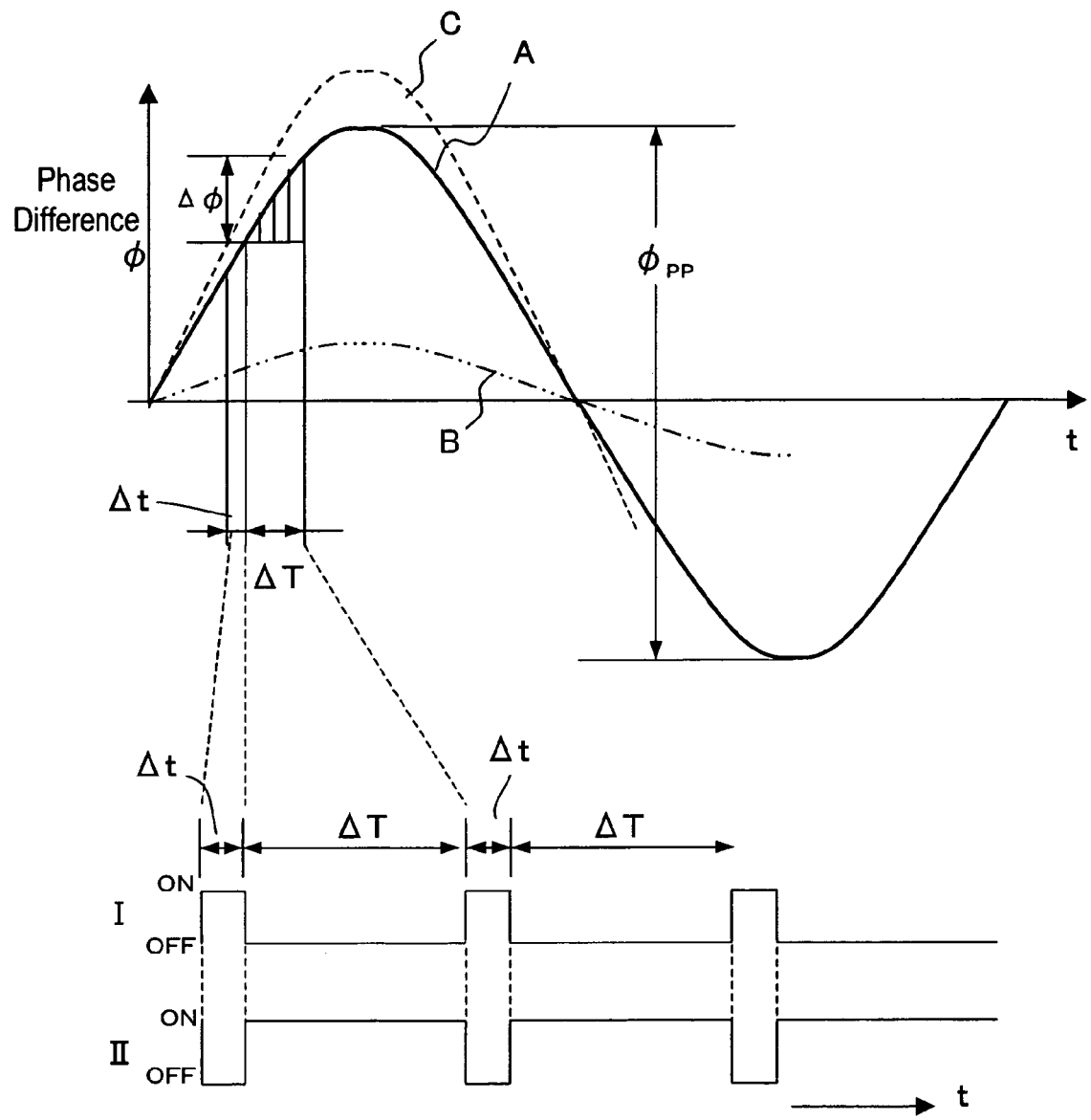
FIG. 8 shows a diagram illustrating an intermittent update processing in phase adjustment circuit 68 shown in FIG. 7.
Figure 9:
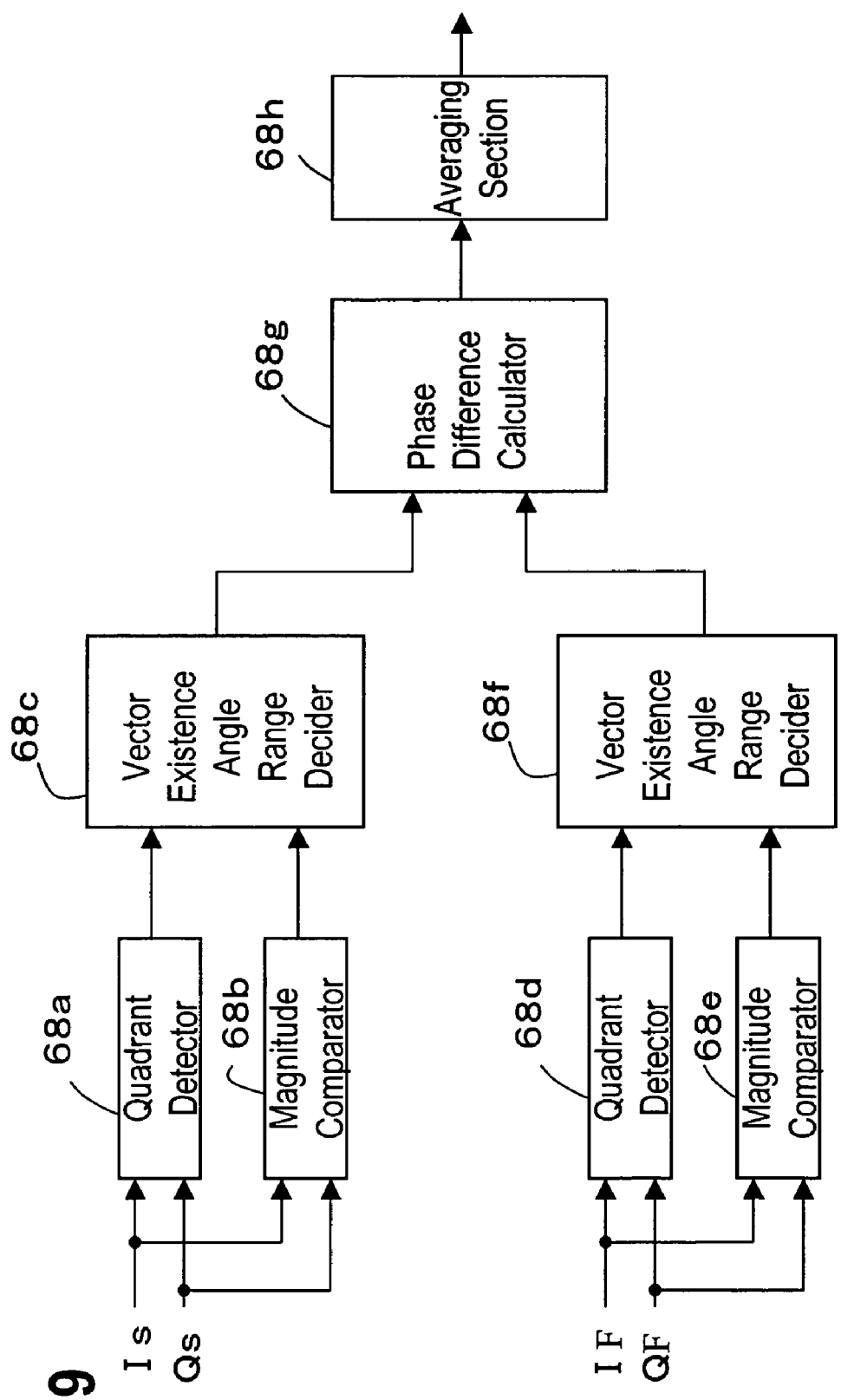
FIG. 9 shows a configuration diagram of a phase difference detector in phase adjustment circuit 68 shown in FIG. 7.
Figure 10:
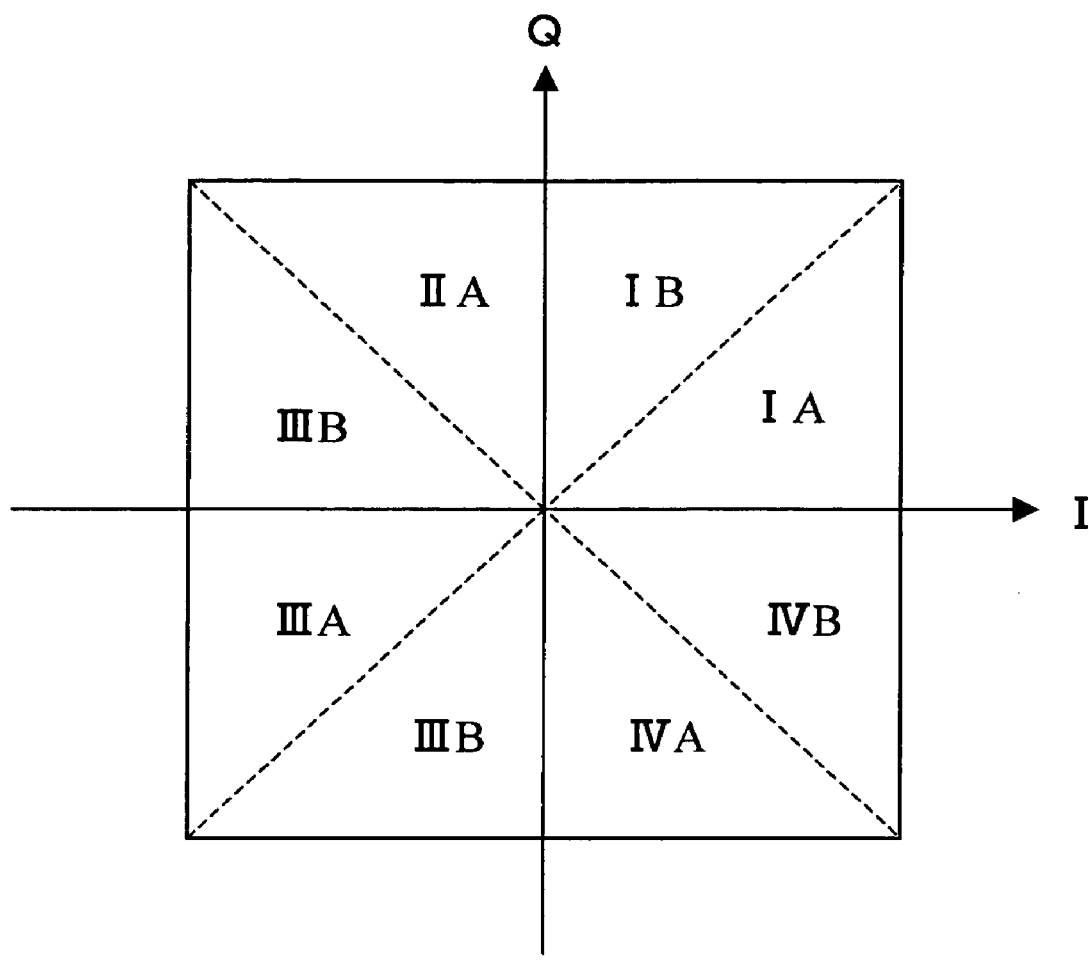
FIG. 10 shows an operation diagram of a quadrant detector in phase adjustment circuit 68 shown in FIG. 7.

However, a calculation section for the update, which is shown by a box 70 enclosed by a broken line in FIG. 7, is represented in an independent block, as an update calculation section 70.

Additionally, in the embodiment of the present invention shown in FIG. 11, CPU 72, correlation calculation section 73, phase rotation section 74, nonvolatile memory 75 are provided, which are connected via a common bus 71.

Figure 12:
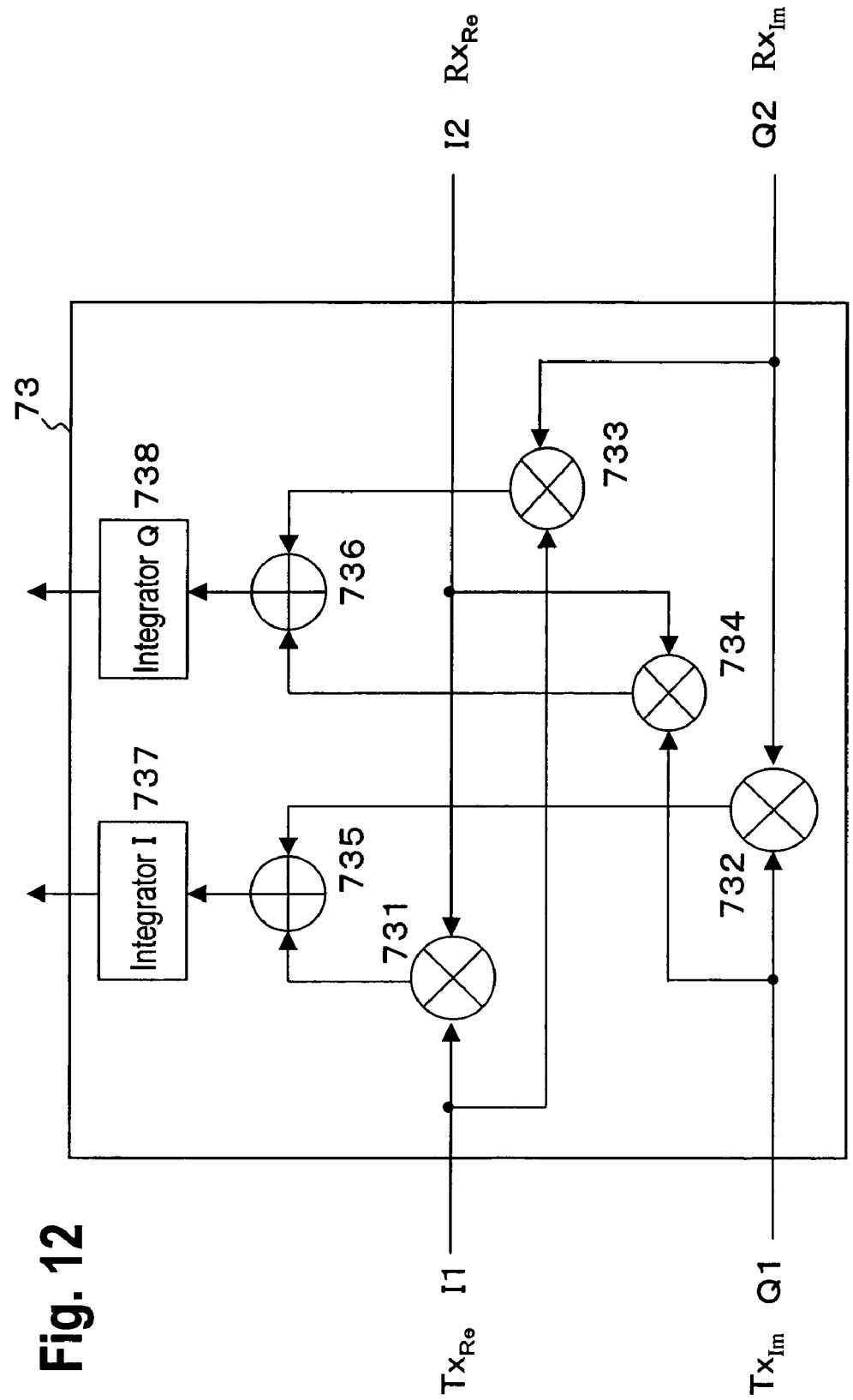
FIG. 12 shows a diagram illustrating an exemplary configuration of a correlation calculation section 73 in the embodiment shown in FIG. 11.
Figure 13:
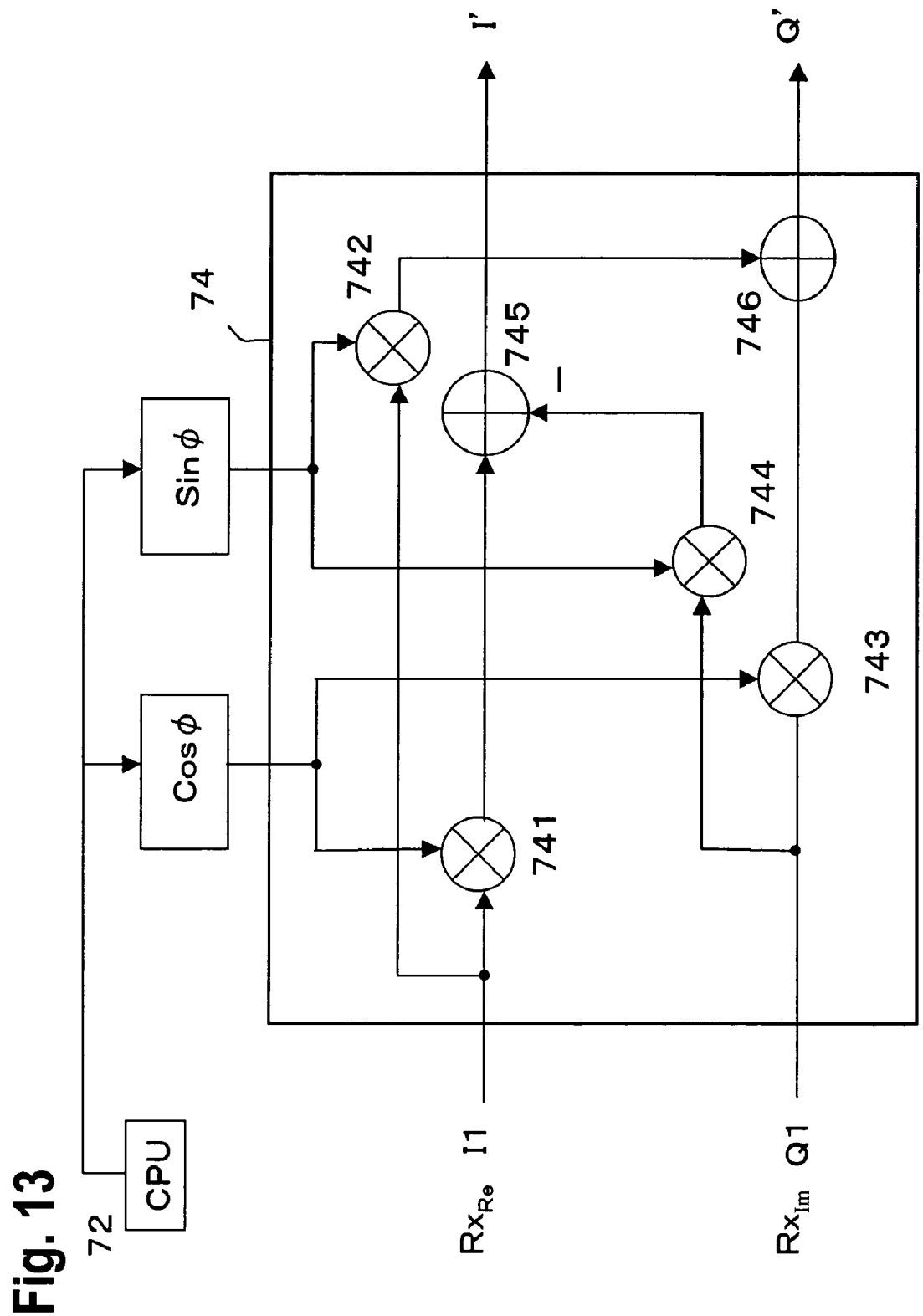
FIG. 13 shows a diagram illustrating an exemplary configuration of a phase rotation section 74 in the embodiment shown in FIG. 11.

Basically, correlation calculation section 73 and phase rotation section 74 can be configured by a combination of multipliers and adders, as shown in FIGS. 12 and 13.

Here, for the sake of simplification, a transmission signal x(t) and a feedback signal y(t) of the transmission output from a transmission amplifier 53 are respectively expressed as Tx and Rx. As having been mentioned before, x(t):Tx and y(t):Rx are complex signals, and the components of the respective real parts and imaginary parts are expressed as $Tx_{Re}$, $Tx_{IM}$, and $Rx_{Re}$, $Rx_{IM}$, respectively.

FIG. 12 is a configuration example of correlation calculation section 73, which includes multipliers 731-734, adders 735, 736, and integrators 737, 738. Also, correlation calculation section 73 includes ports I1, Q1, I2, and Q2. To ports I1, Q1, the components $Tx_{Re}$, $Tx_{IM}$ i.e. the real part and the imaginary part of the transmission signal Tx are input. Meanwhile, to ports I2, Q2, the components $Rx_{Re}$, $Rx_{IM}$ i.e. the real part and the imaginary part of the feedback signal Rx, on which phase rotation has been performed in phase rotation section 74, are input.

Here, as to the aforementioned reference signal and the feedback signal, which are complex signals, when the real part and the imaginary part of the above reference signal are expressed as $Tx_{Re}$, $Tx_{IM}$, and the real part and the imaginary part of the above feedback signal are expressed as $Rx_{Re}$, $Rx_{IM}$, respectively:

The correlation calculation section 73 includes a first multiplier 731 for multiplying $Tx_{Re}$ by $Rx_{Re}$; a second multiplier 732 for multiplying $Tx_{IM}$ by $Rx_{IM}$; a third multiplier 733 for multiplying $Tx_{Re}$ by $Rx_{IM}$; a fourth multiplier 734 for multiplying $Tx_{IM}$ by $Rx_{Re}$; a first adder 735 for adding the outputs of the first multiplier 731 and the second multiplier 732; and a second adder 736 for adding the outputs of the third multiplier 733 and the fourth multiplier 734.

Further, correlation calculation section 73 includes an integrator 737 for integrating the outputs of the first adder for a certain period, so as to output as real part of correlation; and an integrator 738 for integrating the outputs of the second adder for a certain period, so as to output as imaginary part of correlation.

The relation of the transmission signal Tx with the feedback signal Rx is as shown in formula (1) below, and accordingly the correlation value of the transmission signal Tx with the feedback signal Rx is obtained by correlation calculation section 73 in the following way:

$$Tx = Tx_{Re} + jTx_{Ij}, Rx = Rx_{Re} + jRx_{IM}$$

$$Rx = Tx \times \exp(j\phi) \qquad (1)$$

$$E[Tx \times Rx^*] = E[Tx \times (Tx \times \exp(j\phi))^*]$$

$$= E[Tx \times Tx^* \times \exp(-j\phi)]$$

$$= E[Tx \times Tx^*] \times \exp(-j\phi)$$

$$= A \times \exp(-j\phi)$$

$$= A \cos\phi - jA \sin\phi$$

Here, integrators 737, 738 shown in FIG. 12 is provided for obtaining a mean value in a certain period. From the respective integrators 737, 738, the real parts of correlation (A cos φ) and the imaginary parts of correlation (A sin φ) of both the transmission signal Tx and the feedback signal Rx are obtained.

Next, as a feature of the present invention, from the output values of the real part of correlation (A cos φ) and the imaginary part of correlation (A sin φ) having been obtained from correlation calculation section 73, CPU 72 calculates a formula (2) shown below, and obtains phase-shift angle φ.

$$\varphi = \tan^{-}\left(\frac{\text{imaginary part of the correlation}}{\text{real part of the correlation}}\right) \qquad (2)$$

Usually, [imaginary part of correlation/real part of correlation] can have any value ranging between −∞ to +∞. Therefore, it is not possible to store [the imaginary part of correlation/the real part of correlation] correspondingly to φ, and accordingly storage data cannot be used. However, in the embodiment described later, it is devised so that storage data is used.

Now, based on the phase-shift angle obtained above, CPU 72 performs phase adjustment by controlling the readout phase of discrete value data of a sine wave and a cosine wave to be supplied to phase rotation section 74, as will be described later.

Namely, in FIG. 13, an exemplary configuration of phase rotation section 74 is shown. Phase rotation section 74 includes multipliers 741-744, and adders 745, 746.

Phase rotation section 74 further includes ports for inputting the discrete value data of the cosine wave and the sine wave, of which readout phase have been controlled; input ports I1, Q1 for inputting the components of the real part and the imaginary part, $Rx_{Re}$ and $Rx_{IM}$, of the feedback signal Rx fed from A/D converter 54; and output ports I', Q' for outputting the components of the real part and the imaginary part which have been phase-rotated.

Further, when the real part and the imaginary part of the above-mentioned feedback signal, a complex signal, are expressed as $Rx_{Re}$ and $Rx_{IM}$, phase rotation section 74 includes a first multiplier 741 for multiplying $Rx_{Re}$ by a discrete cosine-wave signal supplied from the above-mentioned CPU 72; a second multiplier 743 for multiplying $Rx_{IM}$ by the above discrete cosine-wave signal; a third multiplier 744 for multiplying $Rx_{IM}$ by a discrete sine-wave signal; a fourth multiplier 742 for multiplying $Rx_{Re}$ by the above discrete sine-wave signal; a first adder 745 for adding the output of first multiplier 741 to the output of third multiplier 744, and outputting the real part of the above phase-rotated feedback signal; and a second adder 746 for adding the output of second multiplier 743 to the output of fourth multiplier 742, and outputting the imaginary part of the above phase-rotated feedback signal.

In nonvolatile memory 75, discrete value data of the cosine wave and the sine wave (or either one of the cosine wave or the sine wave may be acceptable) are stored for at least one period. CPU 72 successively reads out these discrete value data, with a readout start phase of φ, and inputs the readout data to the ports for inputting the discrete value data of the cosine wave and the sine wave. The above discrete value data of the cosine wave and the sine wave are as illustrated in FIG. 14. As shown in the figure, the readout start phases of the both waves are equally set to φ.

Figure 14A:
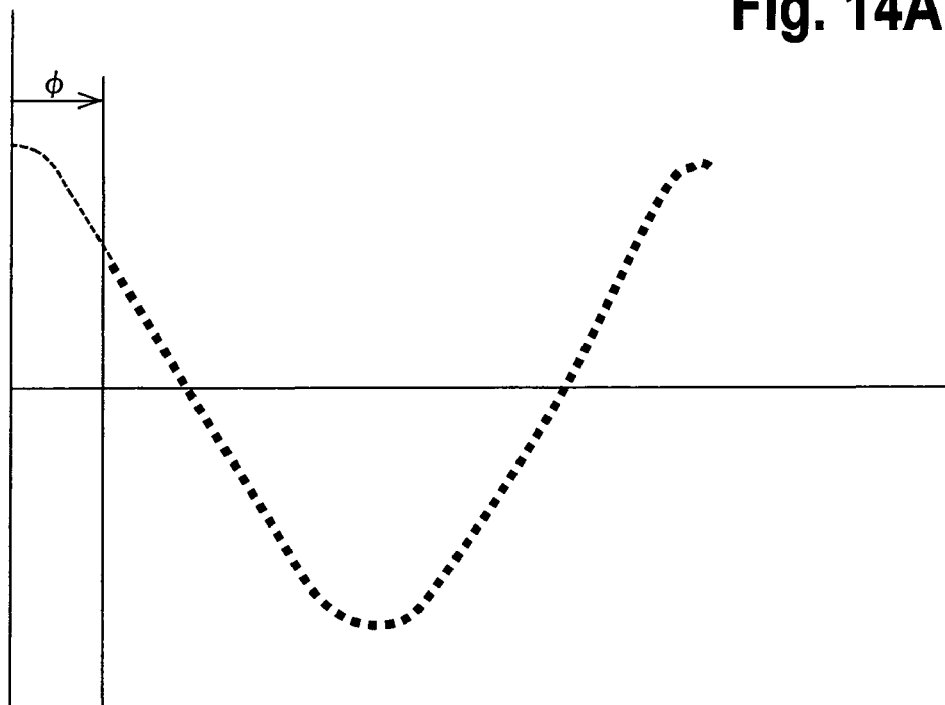
FIGS. 14A, 14B show diagrams illustrating discrete value data of cos φ and sin φ.
Figure 14B:
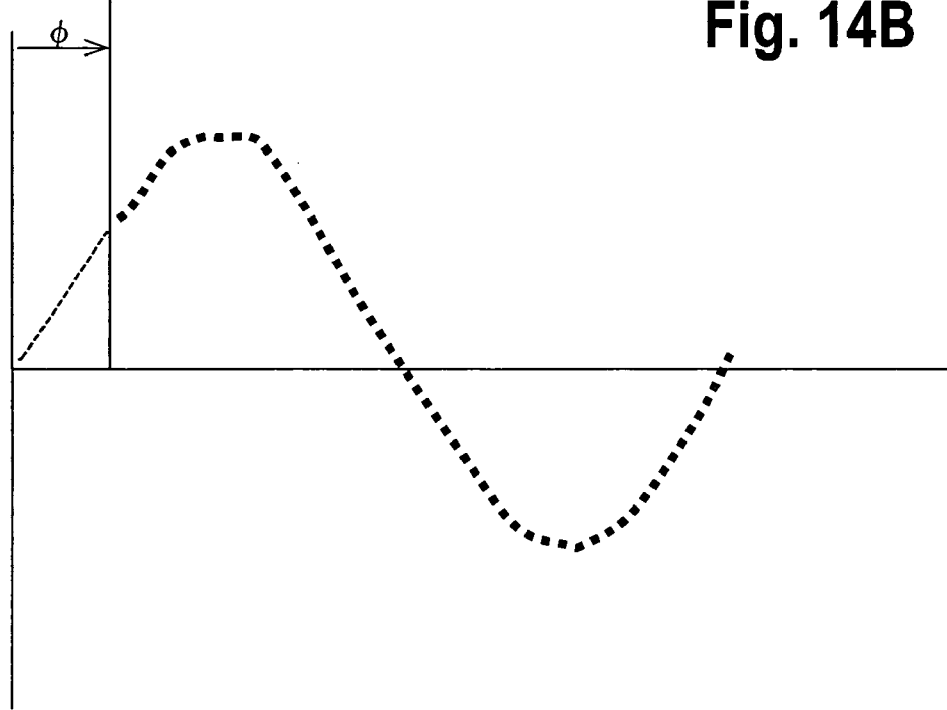

Here, the values of φ in FIGS. 14A, 14B are the phase-shift angles obtained in CPU 72 by calculating the aforementioned formula (2), based on the output values of the real part of correlation (A cos φ) and the imaginary part thereof (A sin φ) fed from correlation calculation section 73. The start positions of the discrete value data of cos φ and sin φ, which are forwarded from CPU 72 to phase rotation section 74, are determined correspondingly to the aforementioned phase-shift angle φ.

With this, phase rotation section 74 supplies a feedback signal Rx of which phase-shift angle is corrected, to update calculation section 70.

Next, in update calculation section 70, as having been illustrated in FIG. 7, a distortion compensation coefficient $h_{n+1}(p)$ for update can be obtained, based on the reference signal Tx and the feedback signal Rx of which phases are synchronized in distortion compensation coefficient updater 67.

In FIG. 15, in order to correct a phase-shift variation Δφ, there is shown a process of updating, in the embodiment configuration shown in the above FIG. 11, the distortion compensation coefficients stored in distortion compensation coefficient lookup table 61 during an intermittent update period P1, and performing calculation of the distortion compensation coefficient for the update in update calculation section 70 during an interval period P2 between the update period P1. This processing procedure is the same as in the process disclosed in the prior application (patent document 2) having been illustrated in FIG. 7.

Finally, a method for obtaining φ using the storage data is explained below.

The correspondence relation between φ and [the imaginary part of correlation/the real part of correlation] is stored in a table form. If CPU 72 can obtain φ by referring to the table, using as key (reference parameter) the value of [the imaginary part of correlation/the real part of correlation] obtained by formula (2), the calculation time for obtaining φ can be omitted, which enables high speed processing. However, since the reference parameter can have a value in the range of −∞ to +∞, it may not be possible to provide the table without modification.

Figure 16:
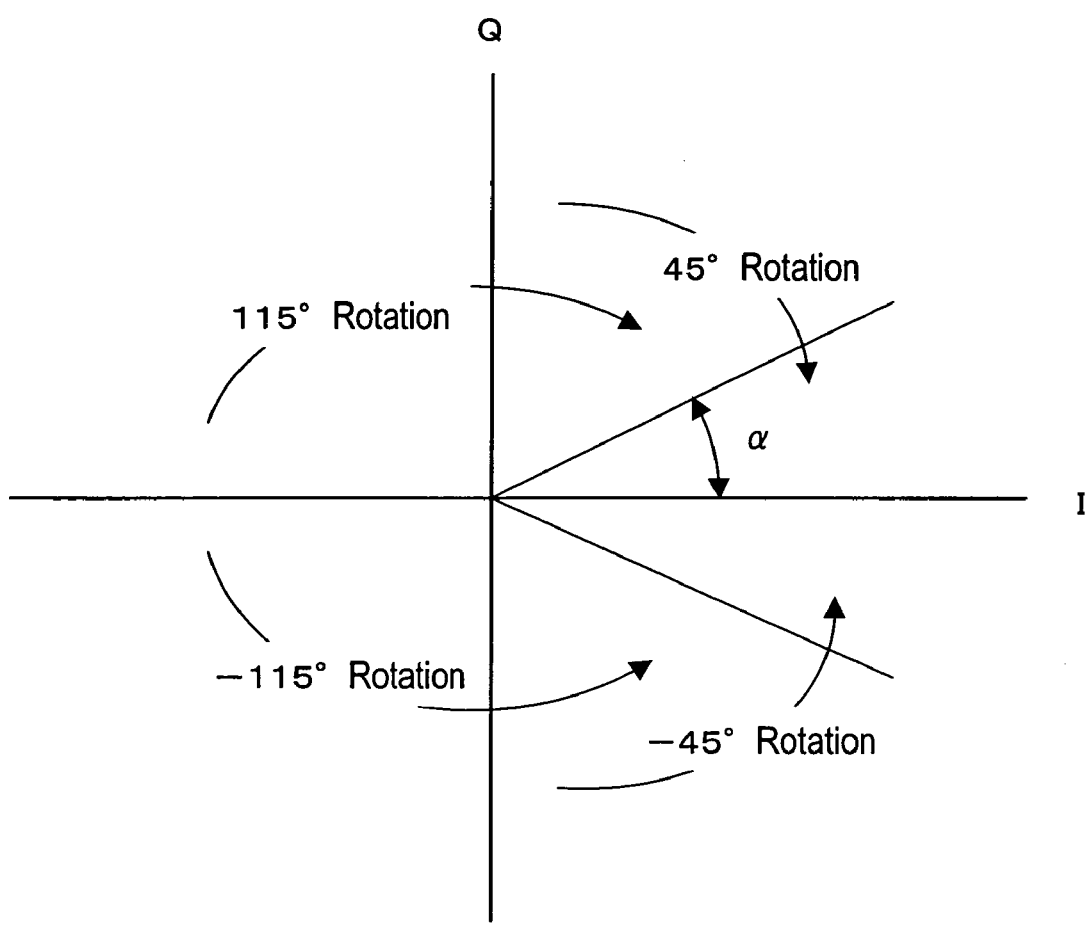
FIG. 16 shows a diagram illustrating a finite range '−α to +α' of a phase shift angle.

Therefore, according to the present invention, the range of φ is restricted within a finite range, −α to +α, as shown in FIG. 16. The corresponding values of [the imaginary part of correlation/the real part of correlation] are prepared discretely in the table form, and are referred to. Namely, as an embodiment, a phase value (φ) at the step of 0.1° and the corresponding [imaginary part of correlation/real part of correlation] are stored in the table, so as to enable phase adjustment with that accuracy. Since the values of [the imaginary part of correlation/the real part of correlation] are discrete, needless to say, a discrete value nearest to the value of [the imaginary part of correlation/the real part of correlation] is obtained, and used as key.

Here, in case of φ satisfying | the imaginary part (Q) of correlation/the real part (I) of correlation |>β (where x is positive), and |φ|>α, there is no value of φ stored in the table.

Therefore, when | the imaginary part (Q) of correlation/the real part (I) of correlation |<β, CPU 72 obtains φ by referring to the table using [the imaginary part (Q) of correlation/the real part (I) of correlation] as key, while when | the imaginary part (Q) of correlation/the real part (I) of correlation |>β, CPU 72 decides the signs of the imaginary part (Q) of correlation and the real part (I) of correlation (i.e. the outputs of integrators 737, 738 in the symbol 73 shown in FIG. 12). As shown in FIG. 16, when both signs are positive, which signifies the first quadrant, 45° is selected as φ. When the signs are positive and negative, which signifies the second quadrant, 115° is selected as φ. Also, when both signs are negative, which signifies the third quadrant, −115° is selected as φ, and further when the signs are negative and positive, which signifies the fourth quadrant, −45° is selected as φ.

Then, to perform rotation by the selected φ, the corresponding data are output to phase rotation section 74, and a phase rotation process is performed on the feedback signal. Thus, the phase deviation from the reference signal is reduced.

Also, at this time, in the intermittent update period P1 shown in FIG. 15, as to whether update of the distortion compensation coefficients in distortion compensation coefficient lookup table 61 is to be performed, the same parameter of [the imaginary part (Q) of correlation/the real part (I) of correlation] is applicable.

Namely, when the value (Q/I) exceeds α, it is decided that the value is in the range of being difficult to perform distortion compensation normally, even when distortion compensation coefficient lookup table 61 is updated. Accordingly, no update operation of distortion compensation coefficient lookup table 61 is performed during this period (P1), and the process is moved to phase adjustment. On the other hand, when the value (Q/I) is not greater than α, distortion compensation coefficient lookup table 61 is updated because the phase adjustment can be performed with high accuracy.

Namely, CPU 72 functions as detection section for detecting the phase deviation between the reference signal and the feedback signal. Further, when the phase deviation exceeds a predetermined value, CPU 72 functions as update control section, by which the update processing of the distortion compensation coefficients based on the reference signal and the feedback signal is restrained (namely, updating the LUT is restrained by controlling update calculation section 70.)

At this time, preferably, CPU 72 controls to repeat the update period (P1) and the phase compensation period (P2) in turn, as shown in FIG. 15. Thus, the update processing in the update period P1 is either restrained or permitted. Here, in case the non-update period P2 continues, it may be possible to modify so that the update is performed once in a predetermined number of times.

Additionally, in the above embodiment, the phase rotation is performed in regard to the feedback signal. However, it may also be possible to perform the phase rotation in regard to the reference signal.

According to the present invention, it is possible to update a distortion compensation coefficient stably through the decision of phase stability (based on the values of α) by use of a parameter (Q/I). Also, a calculation time in CPU can be reduced drastically (to approximately 1/100). Corresponding to the above, a phase adjustment time is shortened, which makes the most of the effect of intermittently updating distortion compensation coefficient lookup table 61. Further, in regard to hardware to be added, the circuit scale can be reduced because a correlation calculation section and a phase rotation section are configured of general-purpose multipliers, adders and integrators.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A distortion compensation apparatus comprising:
    an update calculation section calculating a distortion compensation coefficient by use of an adaptive algorithm, so as to reduce a differential signal between a reference signal, which is a transmission signal, and a feedback signal, the reference signal and the feedback signal being complex signals;
    a distortion compensation coefficient storage of which stored content is updated by the calculated distortion compensation coefficient;
    a distortion compensation section performing distortion compensation to the transmission signal, based on the distortion compensation coefficient being read out from the distortion compensation coefficient storage;
    a correlation calculation section calculating a real part of correlation and an imaginary part of correlation of each the reference signal and the feedback signal; and
    a phase rotation section compensating a relative phase deviation between the reference signal and the feedback signal, based on the real part of correlation and the imaginary part of correlation calculated by the correlation calculation section,
    wherein the update calculation section calculates a distortion compensation coefficient using the post-compensation signal.

2. The distortion compensation apparatus according to claim 1, further comprising:
    a storage storing correspondence relation between a value in a predetermined range among the values obtained by the calculation, of the real part of correlation and the imaginary part of correlation, and phase information Φ,
    wherein the phase rotation section performs the compensation based on phase information Φ obtained from the correspondence relation.

3. The distortion compensation apparatus according to claim 2,
    wherein the storage stores a plurality of sets of phase information to be selected when the value obtained from the calculation, of the real part of correlation and the imaginary part of correlation is out of the predetermined range, and
    when the value obtained from the calculation, of the real part of correlation and the imaginary part of correlation is out of the predetermined range, the phase rotation section performs the compensation based on the phase information selected from among the plurality of sets of phase information.

4. The distortion compensation apparatus according to claim 3,
    wherein the selection is performed based on the respective signs of the real part of correlation and the imaginary part of correlation.

5. A The distortion compensation apparatus according to claim 1, further comprising:
    an update control section restraining update processing of the distortion compensation coefficient based on the reference signal and the feedback signal, when the phase deviation exceeds a predetermined value.

6. The distortion compensation apparatus according to claim 1,
    wherein, as to the reference signal and the feedback signal, which are complex signals, respectively, when the real part and the imaginary part of the reference signal are expressed as $TX_{Re}$, $Tx_{IM}$, and the real part and the imaginary part of the feedback signal are expressed as $Rx_{Re}$, $Rx_{IM}$, the correlation calculation section includes a first multiplier for multiplying $TX_{Re}$ by $Rx_{Re}$, a second multiplier for multiplying $Tx_{IM}$ by $Rx_{IM}$, a third multiplier for multiplying $TX_{Re}$ by $Rx_{Re}$, a fourth multiplier for multiplying $Tx_{IM}$ by $Rx_{Re}$, a first adder for adding the first multiplier output and the second multiplier output, and a second adder for adding the third multiplier output and the fourth multiplier output, and
    further, the correlation calculation section integrates the first adder outputs for a certain period, so as to output as real part of correlation, and also integrates the second adder outputs for a certain period, so as to output as imaginary part of correlation.

7. The distortion compensation apparatus according to claim 1,
    wherein the phase rotation section comprises a first multiplier for multiplying $RX_{Re}$ by a discrete cos-Φ signal supplied from a CPU; a second multiplier for multiplying $Rx_{IM}$ by the discrete cos-Φ signal; a third multiplier for multiplying $Rx_{IM}$ by a discrete sin-101 signal; a fourth multiplier for multiplying $RX_{Re}$ by the discrete sin-Φ signal; a first adder for adding the first multiplier output to the third multiplier output, and outputting the real part of the phase-rotated feedback signal; and a second adder for adding the second multiplier output to the fourth multiplier output, and outputting the imaginary part of the phase-rotated feedback signal, wherein the update calculation section calculates a distortion compensation coefficient using the post-compensation signal.

8. A distortion compensation method comprising:

calculating a distortion compensation coefficient by use of an adaptive algorithm, so as to reduce a differential signal between a reference signal, which is a transmission signal, and a feedback signal, the reference signal and the feedback signal being complex signals;

updating contents stored in a distortion compensation coefficient storage by the calculated distortion compensation coefficient;

performing distortion compensation to the transmission signal, based on the distortion compensation coefficient being read out from the distortion compensation coefficient storage;

calculating a real part of correlation and an imaginary part of correlation of each the reference signal and the feedback signal; and compensating a relative phase deviation between the reference signal and the feedback signal, based on the real part of correlation and the imaginary part of correlation calculated by the correlation calculation section, wherein when calculating a distortion compensation coefficient, the post-compensation signal is used.

9. The distortion compensation method according to claim 8, further comprising:

storing correspondence relation between a value in a predetermined range among the values obtained by the calculation, of the real part of correlation/ and the imaginary part of correlation, and phase information $\Phi$, wherein the compensation is based on phase information $\Phi$ obtained from the correspondence relation.

10. The distortion compensation method according to claim 9, further comprising:

storing a plurality of sets of phase information to be selected when the value obtained from the calculation, of the real part of correlation and the imaginary part of correlation is out of the predetermined range, wherein when the value obtained from the calculation, of the real part of correlation and the imaginary part of correlation is out of the predetermined range, the phase rotation section performs the compensation based on the phase information selected from among the plurality of sets of phase information.

11. The distortion compensation method according to claimed 10, wherein the selection is performed based on the respective signs of the real part of correlation and the imaginary part of correlation.

12. The distortion compensation method according to claim 8, further comprising:

restraining update processing of the distortion compensation coefficient based on the reference signal and the feedback signal, when the phase deviation exceeds a predetermined value.

* * * * *